United States Patent
Piesinger

(10) Patent No.: US 9,255,954 B2
(45) Date of Patent: Feb. 9, 2016

(54) METHOD AND APPARATUS FOR PHASE IDENTIFICATION IN A THREE-PHASE POWER DISTRIBUTION NETWORK USING SERVERS

(71) Applicant: Gregory Hubert Piesinger, Cave Creek, AZ (US)

(72) Inventor: Gregory Hubert Piesinger, Cave Creek, AZ (US)

( * ) Notice: Subject to any disclaimer, the term of this patent is extended or adjusted under 35 U.S.C. 154(b) by 102 days.

(21) Appl. No.: 13/947,480

(22) Filed: Jul. 22, 2013

(65) Prior Publication Data

US 2015/0022180 A1    Jan. 22, 2015

(51) Int. Cl.
*G01R 25/00* (2006.01)
*G01R 29/18* (2006.01)

(52) U.S. Cl.
CPC ............... *G01R 29/18* (2013.01); *G01R 25/00* (2013.01); *G01R 25/005* (2013.01)

(58) Field of Classification Search
CPC ....... G01R 25/005; G01R 29/18; G01R 25/00
USPC .............................................. 324/66; 702/72
See application file for complete search history.

(56) References Cited

U.S. PATENT DOCUMENTS

| | | | |
|---|---|---|---|
| 3,027,513 A * | 3/1962 | Mulavey et al. ........... | 324/76.83 |
| 6,667,610 B2 | 12/2003 | Piesinger | |
| 7,031,859 B2 | 4/2006 | Piesinger | |
| 8,285,500 B2 * | 10/2012 | Kreiss et al. ........... | G06Q 50/06 324/424 |
| 8,533,121 B1 * | 9/2013 | Piesinger ........................ | 705/57 |
| 2003/0184275 A1 * | 10/2003 | Slade et al. ..................... | 324/66 |
| 2004/0263147 A1 * | 12/2004 | Piesinger ........................ | 324/86 |
| 2008/0116877 A1 * | 5/2008 | Giubbini et al. ................ | 324/84 |
| 2011/0210889 A1 * | 9/2011 | Dai et al. ................ | 342/357.29 |

* cited by examiner

*Primary Examiner* — Jeff Natalini

(57) ABSTRACT

A remote phase identification system identifies the unknown phase attribute of any energized conductor within a three-phase power distribution network. A base station at a reference location obtains a reference phase each GPS second and stores it on one or more servers. A field probe at a remote location obtains an instantaneous phase measurement at a GPS second and communicates this phase to a field client. The field client communicates with the server either by wireless Internet or satellite modem to compare its field location phase measurement with the reference location phase measurement taken at the same GPS second. Field client tagging reference phase configuration files are automatically created for any circuit. Configuration files can be named, saved, and loaded and are used by the field client to identify and display the unknown field location phase attribute. A field client can be any personal computer, smartphone, or personal digital assistant.

6 Claims, 12 Drawing Sheets

500

1. Base station at reference location measures and stores instantaneous phase at each GPS second on server.

2. Field probe at field location measures an instantaneous phase at a GPS second.

3. Field probe communicates measured instantaneous phase and GPS second to field client at field location.

4. Field client transmits phase attribute request for the GPS second to server.

5. Server determines field location phase attribute by comparing field location and reference location instantaneous phases.

6. Server transmits requested phase attribute back to field client.

7. Field client displays phase attribute.

FIG. 4

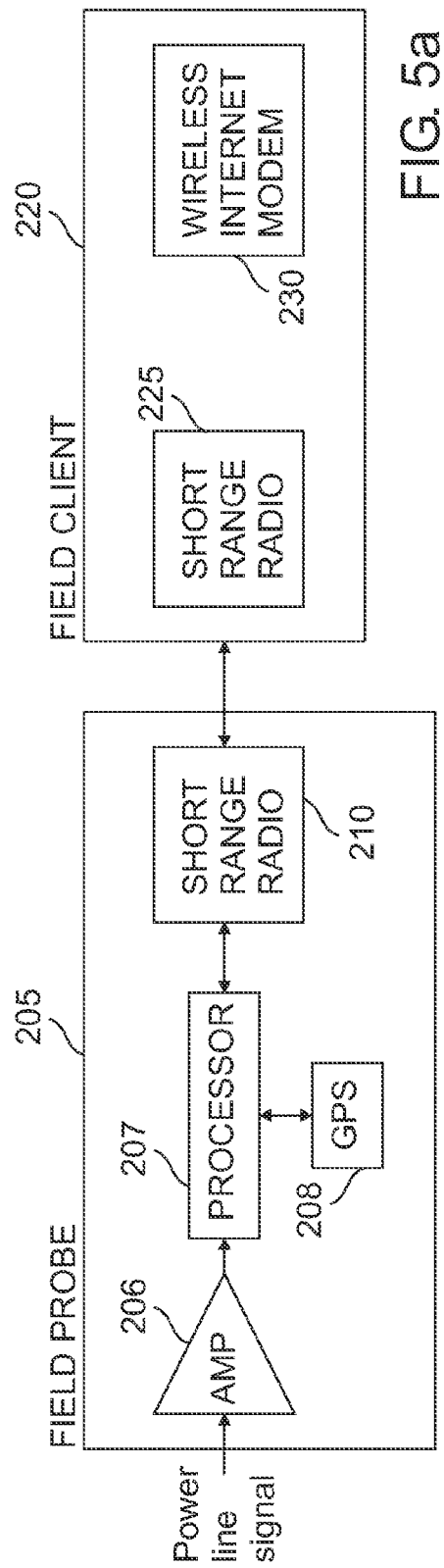
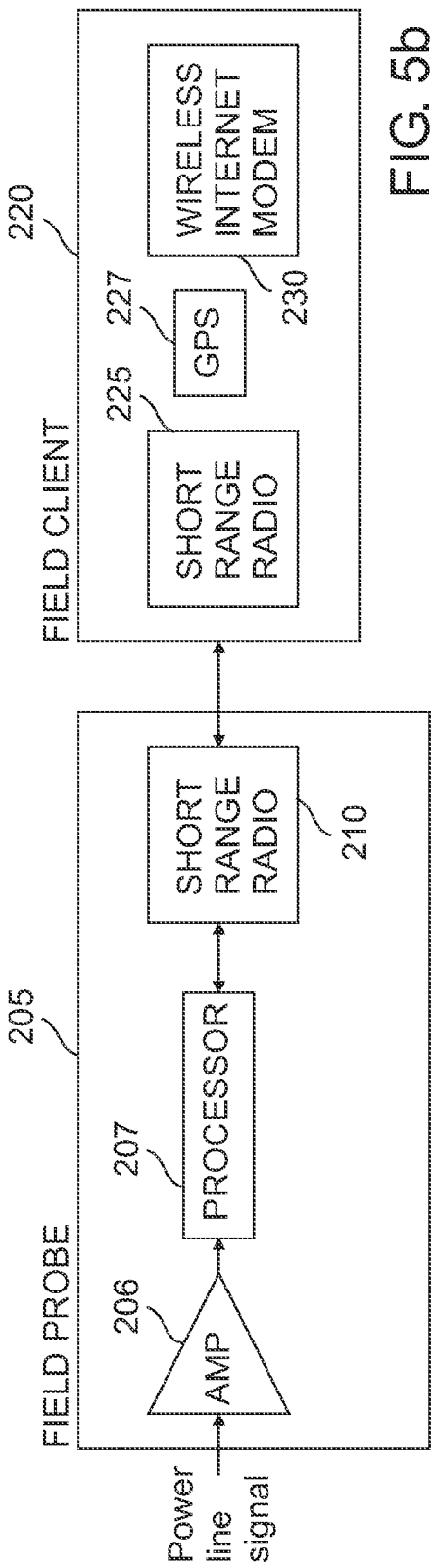

330

| Attribute obtained | Set base to |
|---|---|
| A | A |
| AB | -CA |
| -B | -C |
| -BC | BC |
| C | B |
| CA | -AB |
| -A | -A |
| -AB | CA |
| B | C |
| BC | -BC |
| -C | -B |
| -CA | AB |

1. Select a field location with a known phase attribute.

2. Measure a reference location instantaneous phase at a GPS second.

3. Measure selected field location instantaneous phase at the same GPS second.

3. Add a configuration file offset phase to the reference location instantaneous phase to obtain a new offset reference location instantaneous phase.

4. Compare the field location and offset reference location instantaneous phases.

5. Select the offset phase so that the reported phase attribute of the selected field location equals its known phase attribute.

FIG. 10

METHOD AND APPARATUS FOR PHASE IDENTIFICATION IN A THREE-PHASE POWER DISTRIBUTION NETWORK USING SERVERS

TECHNICAL FIELD OF THE INVENTION

The present invention relates to the field of three-phase power distribution networks. More specifically, the present invention relates to the field of identifying the phase of a cable in a three-phase power distribution network.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage 345,000 volts phase-to-phase (345 KV) is delivered to multiple high voltage substations at which transformers step this high voltage down to a lower three-phase voltage 115 KV. Multiple transmission substations further lower the voltage to 69 KV. This 69 KV three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120 and 240 volts for delivery to the commercial and residential customers.

The instantaneous phases of the three conductors in a three-phase system are separated by 120 degrees. A phase attribute of A, B, or C is typically assigned to each of the three conductors to identify them. The initial assignment of phase attribute to each of the three conductors typically takes place at a transmission or distribution substation and this assignment is somewhat arbitrary. The attributes assigned at the substations become known as the tagging reference phases for that substation because the goal is to consistently tag, mark, or identify each conductor with its proper phase attribute throughout the substation's distribution region.

Utilities have many reasons for accurately identifying the phase of each conductor in their utility. Examples are load balancing to reduce neutral current flow, faster service restoration after outages, and for distribution automation purposes.

Most currently available phase identification instruments use GPS timing signals to obtain instantaneous phase measurements at a reference location and field location at the same instant of time. The phase attribute at the reference location is known which allows the phase attribute at the field location to be determined. For example, if the reference location phase attribute is B and the instantaneous phase measured at both locations are the same, then the field location phase attribute is also B. If the instantaneous field location phase is leading or lagging the instantaneous reference location phase by 120 degrees, then the field location phase attribute is either A or C depending on the utilities known phase rotation.

To identify the field location phase attribute, the instantaneous phases at both locations have to be compared. Current phase identification instruments differ primarily in the method they each use to communicate the instantaneous phase reading between the reference location unit and the field location unit. Most manufacturers implement a real-time communication system using cell phones. Piesinger's, U.S. Pat. Nos. 6,667,610 and 7,031,859 describe a phase identification method that does not require real-time cell phone communication.

Current real-time phase identification systems have a number of shortcomings that make those system difficult to use. In particular, there are 3 primary problems with all current real-time phase identification systems that the present invention overcomes.

The first problem is that current systems require that the user install a dedicated phone line at the reference location. This is both a cost factor and an operational problem in that only one field user can access the reference location at the same time. Other users will receive a busy signal until the current user finishes his field measurements and disconnects from the system.

A second problem is that field cell phone coverage is marginal in most rural areas of the country. Without cell phone service, most current real-time phase identification systems cannot be used in those areas.

A third problem is that no current real-time phase identification system implements an easy method to account for tagging reference phase. Tagging reference phase is the most confusing aspect of phase identification for most linemen. Every time high voltage is stepped down to a lower voltage using a delta-wye or wye-delta transformer, a 30 degree phase rotation occurs. Without an easy way to account for these phase rotations, field phase attribute readings are meaningless.

Accordingly, it is the object of the present invention to provide a new and improved real-time method of identifying the phase of a conductor that solves these problems, overcomes other shortcomings, adds new features, and is easier for line crews to use.

SUMMARY OF THE INVENTION

Briefly, to achieve the desired objects of the present invention, the dedicated phone line problem is solved by implementing an Internet based server for reference location phase that can service a very large number of field location users simultaneously over the Internet without the need for a dedicated phone line.

The cell phone coverage problem is solved by implementing an Internet/satellite based data messaging service that allows field users anywhere to communicate with the Internet based server for reference location phase.

The tagging reference phase problem is solved by implementing a method to automatically define a new tagging reference phase whenever one is required. This tagging reference phase is stored in a configuration file and can be instantly loaded whenever it is needed.

It is a further object of the present invention to implement cloud computing servers where one or more cloud computing servers store phase measurements from multiple reference locations and determine phase attributes for multiple field locations.

It is a further object of the present invention to implement a datalogger function to store the phase attribute and GPS location of each field location measurement along with user reports and notes about the measurement.

It is a further object of the present invention to implement a handheld field location unit that can be used by lower-labor-cost non-linemen personnel.

It is a further object of the present invention to implement portions of the field location units on currently available smartphones.

These and other embodiments are discussed below.

BRIEF DESCRIPTION OF THE DRAWINGS

FIG. 4 illustrates the process steps for identifying phase attribute in the present invention.

FIG. 5a illustrates a block diagram of one implementation of a field probe and field client in which the GPS is built into the field probe.

FIG. 5b illustrates a block diagram of one implementation of a field probe and field client in which the GPS is built into the field client.

FIG. 9 illustrates an example of a setup table to create configuration files based on selected tagging reference phase.

FIG. 10 illustrates the process steps to setup tagging reference phase configuration file offset phase.

DETAILED DESCRIPTION OF THE PREFERRED EMBODIMENTS

Commonly owned U.S. Pat. No. 6,667,610 issued Dec. 23, 2003 and U.S. Pat. No. 7,031,859 issued Apr. 18, 2006, which are incorporated herein by reference, describe a non-real-time phase identification system.

Figure 1:
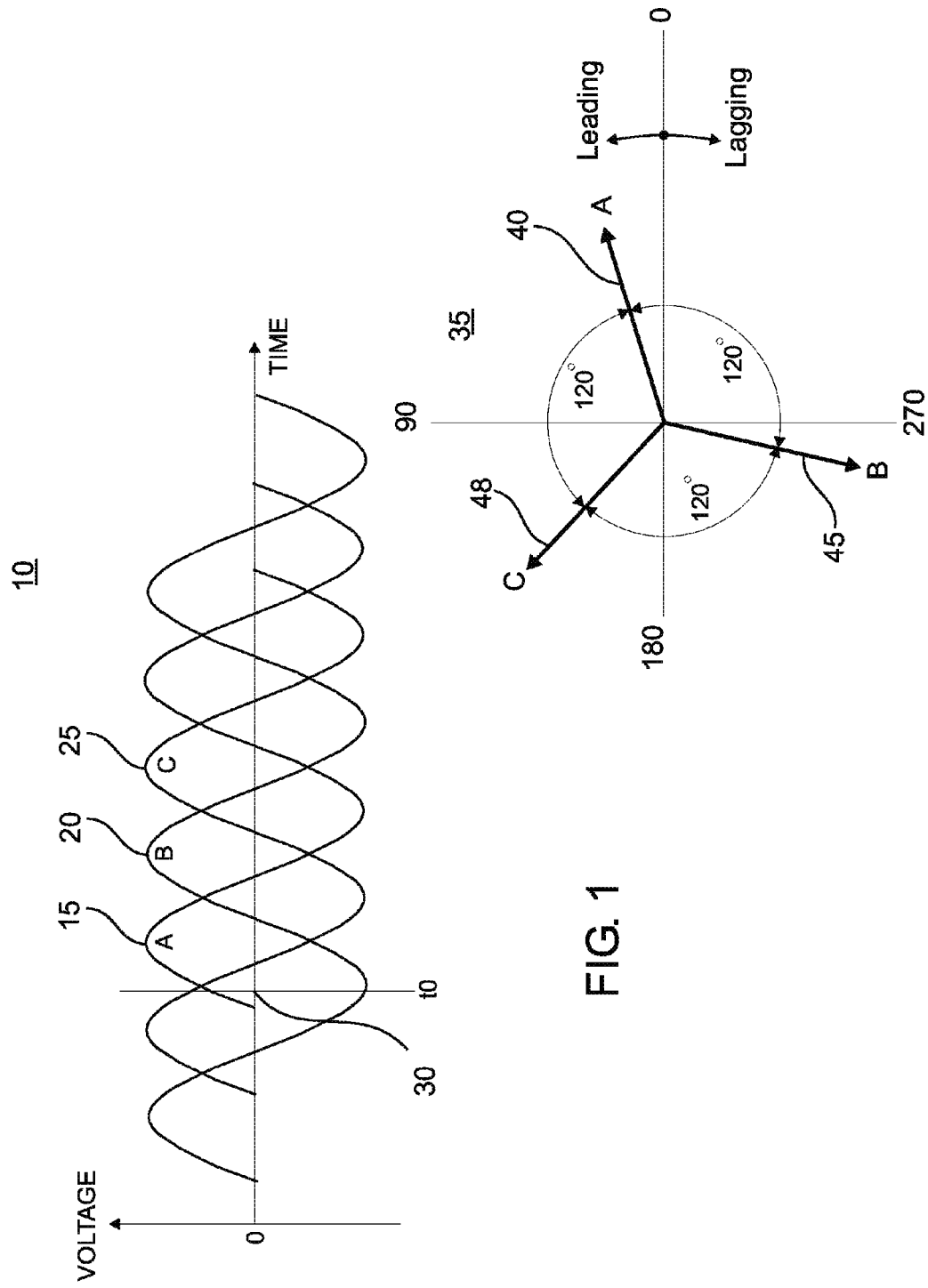
FIG. 1 illustrates voltage phase relationships in a three-phase power network using both voltage-time and phase vector diagrams.

The basic concept of three-phase power is illustrated in FIG. 1. Voltage-time waveform diagram 10 and rotational vector diagram 35 illustrate three-phase voltage-time waveforms 15, 20, and 25 at instantaneous time t0 30. Attribute B voltage 20 and vector 45 lags attribute A voltage 15 and vector 40 by 120 degrees. Likewise, attribute C voltage 25 and vector 48 lags attribute B voltage 20 and vector 45 by 120 degrees.

Figure 2:
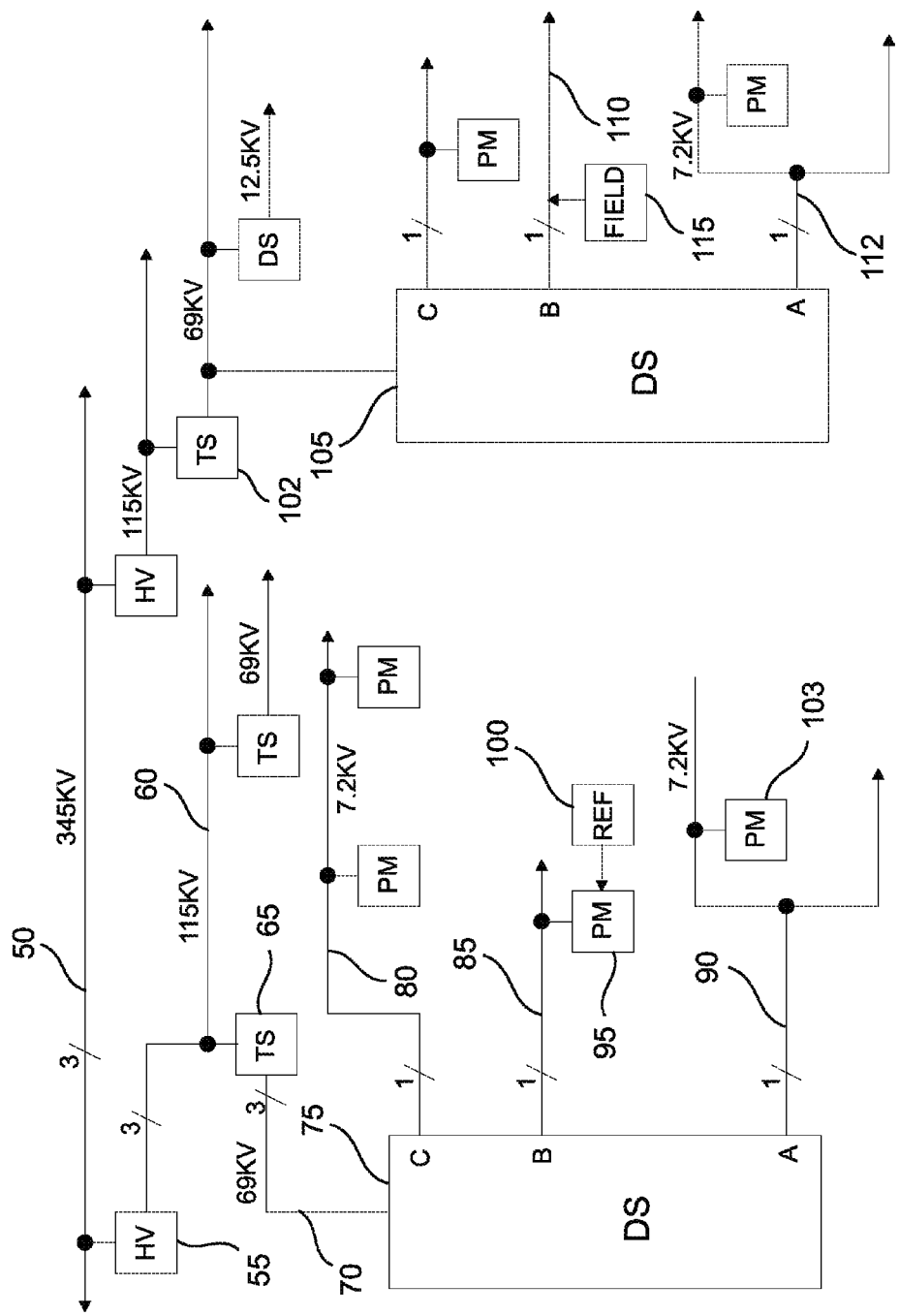
FIG. 2 illustrates a typical three-phase power distribution network.

A typical power distribution network is illustrated in FIG. 2 in which three-phase power cables 50 at 345 KV feed a series of high voltage (HV) transformers 55 spread out over a large geographical area. The 115 KV output 60 of transformers 55 are connected to a series of transmission transformers (TS) 65 also spread out over a large geographical area. The 69 KV output 70 of TS transformers 65 are connected to a series of distribution substation (DS) transformers 75 situated over a smaller geographical area.

The 7.2 KV phase-to-ground (12.5 KV phase-to-phase) phase A feeder 90 of DS transformer 75 powers a local distribution network, which contains a number of pole-mounted or pad-mounted (PM) transformers 103 that are used to provide the final 120/240 volt power to the commercial or residential customers. In the same manner, phase B feeder 85 and phase C feeder 80 also supply power to the same local distribution network.

At some reference location 100 in the power distribution network, a PM transformer 95 is used to provide a low-voltage reference phase that can be used to determine the unknown phase of a conductor at any field location 115 in the network.

As described in referenced U.S. Pat. No. 6,667,610 and U.S. Pat. No. 7,031,859, the instantaneous phase of voltage waveforms at two widely separated points in the power distribution network are measured and compared at the same instant of time using a GPS timing signal. Field location 115 phase measurement and GPS time are encoded into an alphanumeric sequence. At the base location, this sequence is decoded and field location 115 phase measurement is compared to reference location 100 phase measurement taken at the same instant of time.

For field location 115 illustrated in FIG. 2, both instantaneous phase measurements would be the same because both reference location 100 and field location 115 are on phase B. Therefore, conductor 110 would be identified as phase attribute B.

Figure 3:
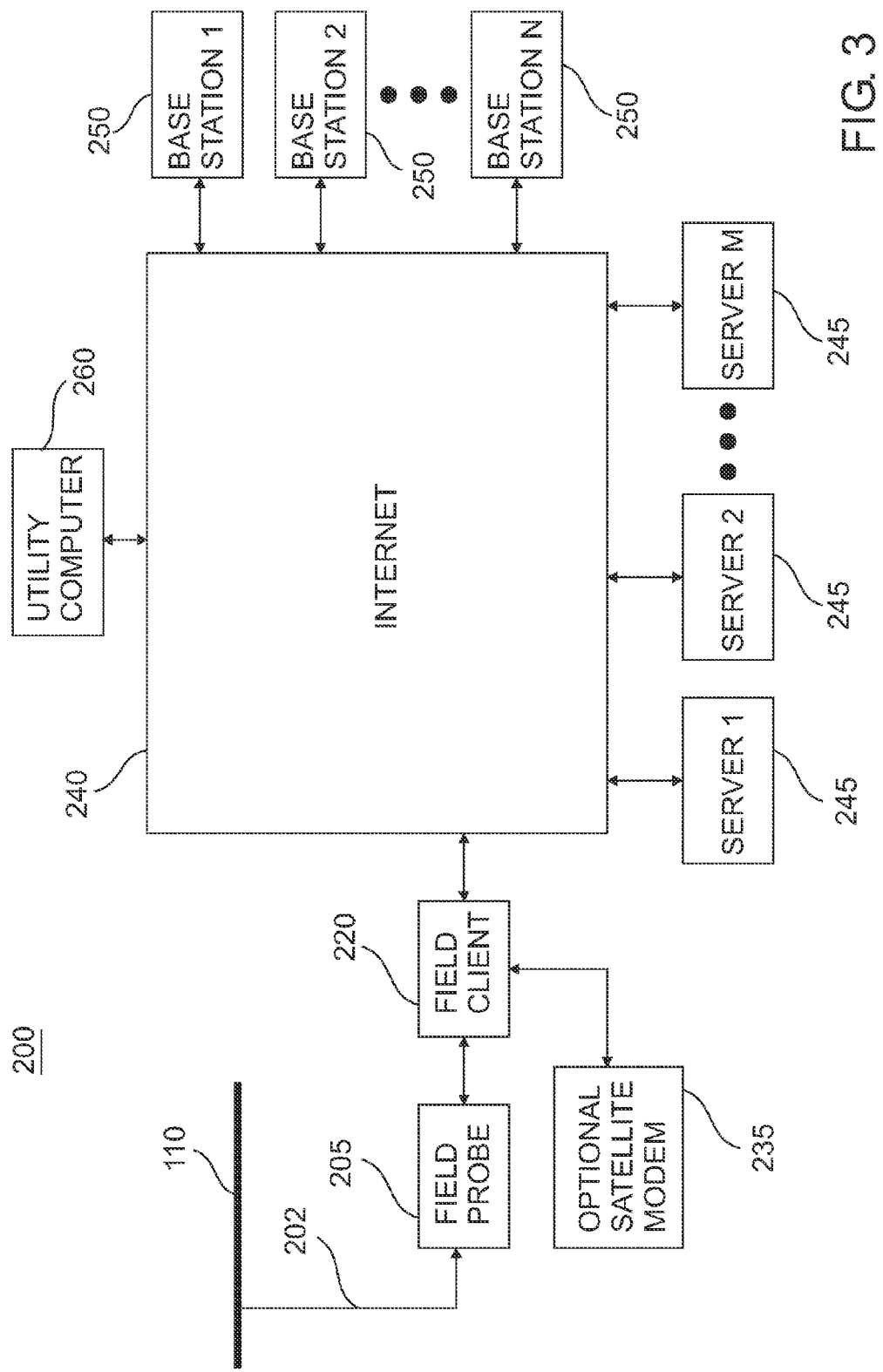
FIG. 3 illustrates a block diagram of the present invention whose main components are the field probe, field client, base stations, and servers.

A block diagram 200 of the present invention is illustrated in FIG. 3. The instantaneous phase of conductor 110 at field location 115 is measured using field probe 205 using connection 202. Connection 202 may be either capacitive, proximity, or direct contact. At a GPS second, field probe 205 takes an instantaneous phase measurement and transmits this information to field client 220. Field client 220 receives this information and transmits a phase attribute request to server 245 through Internet 240 or through optional satellite modem 235 when terrestrial wireless Internet coverage is not available. Satellite modem 235 can be implemented using the Iridium Short Burst Data (SBD) service. This is a low cost short message data service with worldwide coverage. Messages can be sent to either another SBD modem, customer Internet server, or Internet email address.

At each GPS second, base station 250 measures the instantaneous phase from PM transformer 95 on phase B feeder 85 using a 120 volt wall outlet and stores the phase and GPS second on server 245. When server 245 obtains a phase attribute request from field client 220, it retrieves the stored phase at the requested GPS second, compares field probe 205 phase with this reference phase, calculates conductor 110 phase attribute, and sends this phase attribute back to field client 220 through Internet 240 where it is displayed on field client 220. These process steps 500 are listed in FIG. 4.

Server 245 supports multiple field clients 220 and multiple base stations 250. For redundancy, a particular field client 220 can use the reference phase from multiple base stations 250 at one or multiple reference locations. If the prime base station (closest to the user) is down, the next closest base station 250 can be selected to calculate phase attributes.

Likewise, multiple servers 245 can be implemented at one or multiple locations for redundancy. If the normal server 245 is down, field client 220 can select an alternate server. The reference phase data from each base station 250 is sent to multiple servers 245 so field client 220 can use multiple servers 245 to obtain phase attribute. Normally, each base station will send reference phase data to a single server and that server will relay the data via the Internet to the remaining servers. However, a base station may also send the data directly to multiple servers.

The architecture of block diagram 200 in FIG. 3 allows field client 220 to use cloud computing servers where calculations and data are performed and stored respectively on remote servers. This allows field client 220 to use a simple software application to obtain and display phase attributes since all phase attribute calculations can be performed on server 245. Utility company computer 260 can be used by a utility to access their server account to retrieve and maintain their stored data from field clients 220. The goal of the architecture illustrated in FIG. 3 is to provide users a simple and reliable method of measuring phase attributes using a low cost field probe 205 with a smartphone field client 220.

Two implementation options for field probe 205 and field client 220 are illustrated in FIG. 5. In FIG. 5a, the power line input signal from connection 202 in FIG. 3 is amplified using amplifier 206, converted to instantaneous phase at each GPS second in processor 207 using GPS module 208, and transmitted to field client 220 using short range radio 210. In the preferred implementation, field client 220 is a smartphone which includes both short range radio 225 and wireless Internet modem 230.

In FIG. 5b, the power line input signal is amplified using amplifier 206, converted to instantaneous phase in processor 207, and continuously transmitted using short range radio 210. In the preferred implementation, field client 220 is a smartphone which includes short range radio 225, GPS module 227, and wireless Internet modem 230. The advantage of using the implementation in FIG. 5b is that it eliminates having to implement a GPS module in field probe 205 since smartphone field client 220 already contains a GPS module. Field location power line input signal instantaneous phase can be sampled at each GPS second either in field probe 205 or in field client 220.

Field client 220 can also be implemented using a standard portable PC such as a laptop, notebook, or netbook. It can also be implemented using a variety of very portable personal communications devices such as smartphones and personal digital assistants (PDAs).

Many implementation options currently exist for short range radios 210 and 225. The most common option is the BLUETOOTH brand wireless technology standard which is built into most PCs and smartphones.

Wireless Internet modem 230 can be implemented on PCs using an Air Card or Data Card available from many different cellular carrier companies. It is already built-in in essentially all smartphones and some PCs as are Wi-Fi modules which provide Internet connectivity when within range of Wi-Fi access points.

Figure 6:
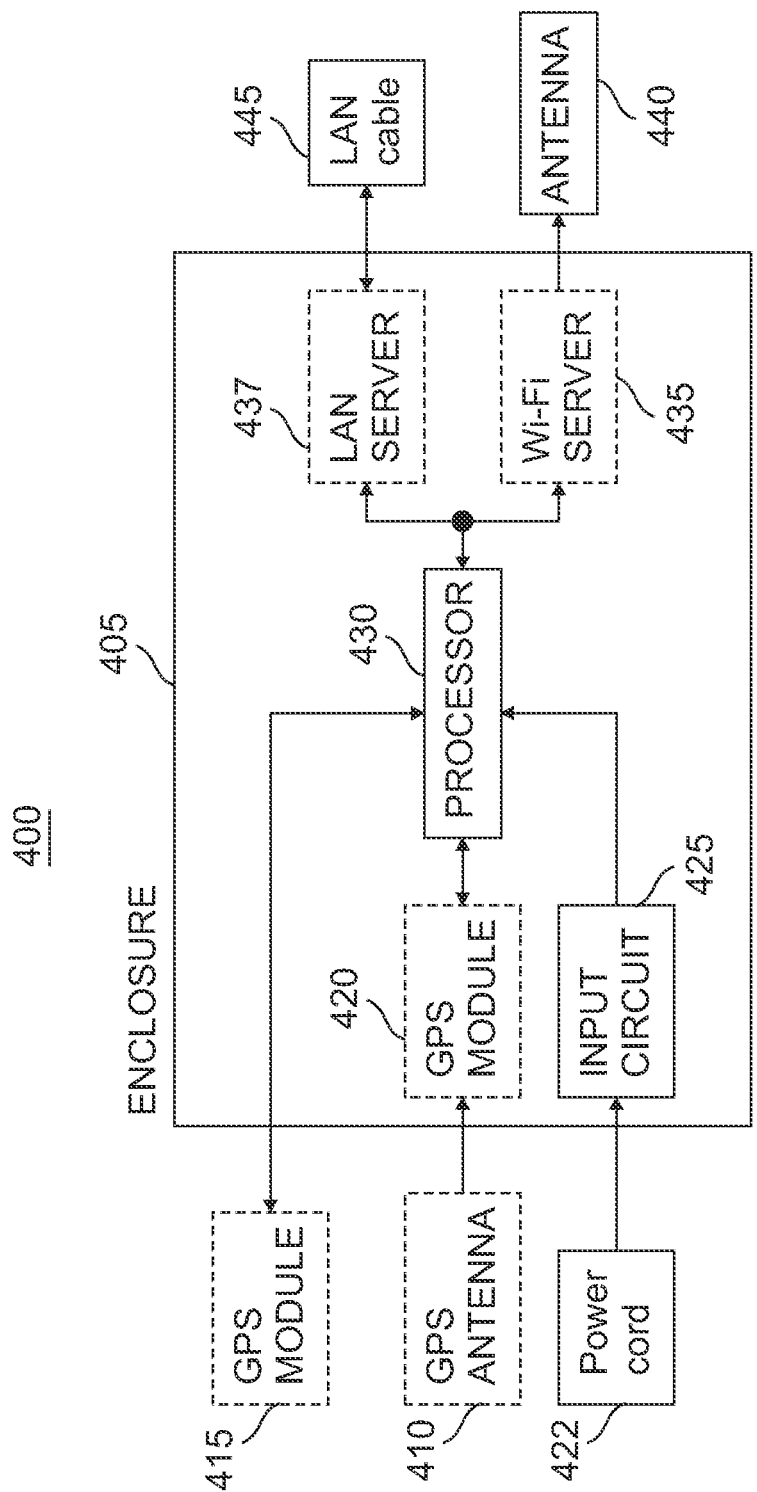
FIG. 6 illustrates a block diagram of various implementations of a base station.

A block diagram 400 for optional implementations of base station 250 is illustrated in FIG. 6. In the preferred option, base station 250 is implemented using GPS antenna 410 which is mounted external to base station enclosure 405. GPS antenna 410 is connected to internal GPS module 420 which is connected to processor 430. Optionally, external GPS module 415 containing a built-in antenna is connected to processor 430. Power cord 422 plugs into any convenient power-line source and provides power and reference phase to base station 250.

In the preferred option, processor 430 drives Wi-Fi server module 435 which uses antenna 440 to connect to any Wi-Fi access point for Internet access. Antenna 440 can be mounted either internally or externally to the base station enclosure 405. Optionally, LAN server 437 and LAN cable 445 can be used to connect directly to a LAN port for Internet access. Reference field location 115 phase measurements are obtained at least once every GPS second and stored on server 245 so multiple users can access the reference phase over the Internet.

The goal of the architecture illustrated in block diagram 400 is to provide a low cost convenient method for customers to obtain and send reference location phase measurements to server 245. GPS module 415 or GPS antenna 410 can be attached to a convenient window using double sided tape or other means. Power cord 422 can be plugged into any 120/240 volt wall outlet. LAN server 437 or Wi-Fi server 435 can connect to an existing utility network to provide Internet access to server 245.

LAN server 437 and Wi-Fi server 435 are available as standard off-the-shelf modules that include embedded software. They can be setup to transmit data only using any PC browser software. Setting for transmit only is a major innovation of the present invention because most utilities will not allow two-way Internet access on their network for security purposes. Currently, utility base stations usually must be connected to a separate Internet access provider such as through a separate DSL line or cable modem totally separate from the utility IT network.

Although tagging reference phase is the most confusing aspect of phase identification for most linemen its concept is quite simple. Tagging reference phase is simply the phase attribute chosen by the utility to designate each of the three feeders from a particular substation. The confusion is due to the difficulty of manually setting up the tagging reference phase configuration file on either field client 220 or server 245.

Figure 7:
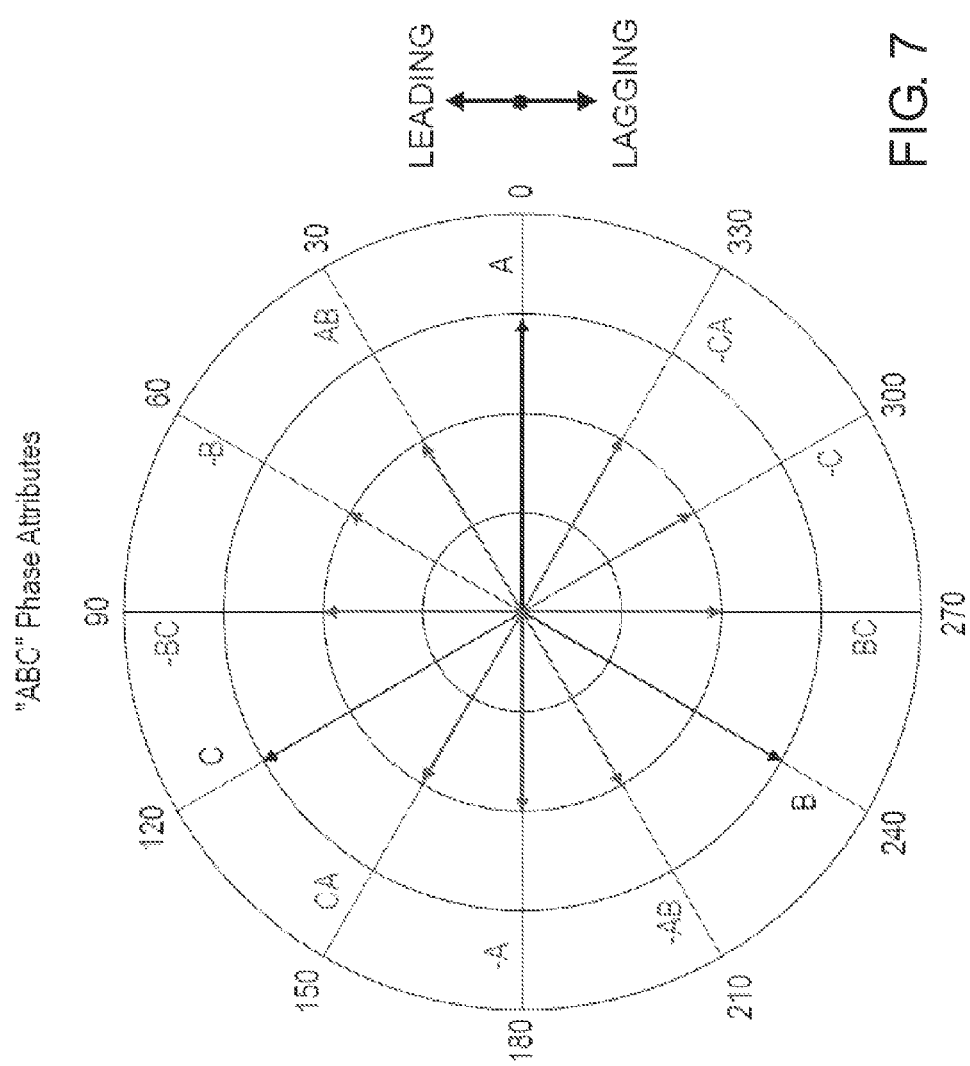
FIG. 7 is a vector diagram that illustrates all 12 phase attributes.
Figure 8:
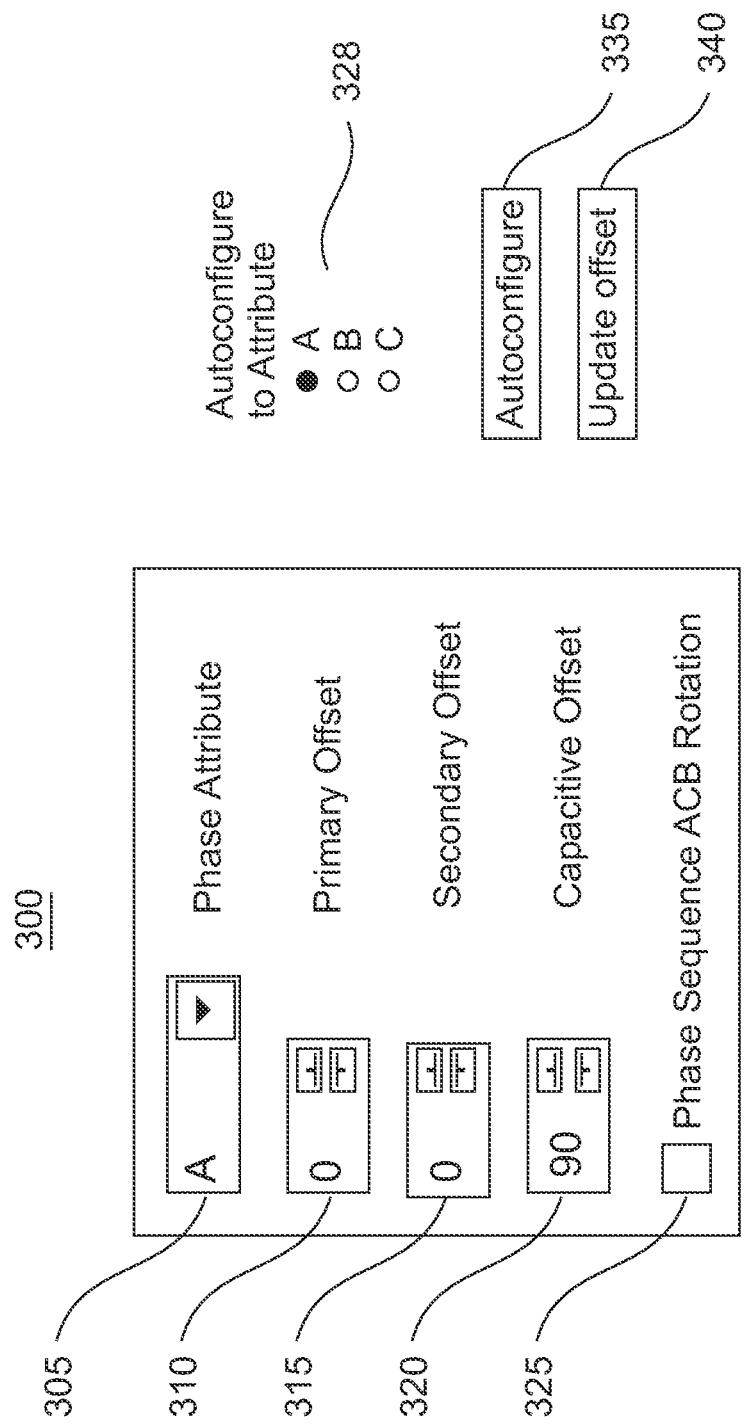
FIG. 8 illustrates an example of a field client configuration file setup screen.

The 12 phase attributes for counterclockwise ABC rotation in FIG. 1 are illustrated in FIG. 7. For clockwise ACB rotation, B attributes in FIG. 7 are changed to C attributes and C attributes in FIG. 7 are changed to B attributes. An example setup screen 300 implemented in field client 220 or server 245 for setting up a tagging reference phase configuration file is illustrated in FIG. 8. Primary and Capacitive connections refer to direct and capacitive field probe 205 connections 202 respectively and indicate phase attributes A, B, or C. Secondary connections 202 refer to direct connections and indicate phase attributes A, −A, B, −B, C, −C, AB, −AB, BC, −BC, CA, and −CA. Offset phases can be chosen for each of these three different types of connections 202. Rotation check box 325 is used to interchange attributes B and C for utilities that use clockwise ACB rotation.

To manually setup the configuration file for distribution substation 105 in FIG. 2, phase attribute 305 of setup screen 300 is initially set to A. Primary offset 310, secondary offset 315, and capacitive offset 320 are set to 0, 0, and 90 degrees respectively. Rotation check box 325 is not checked. A field probe 205 phase measurement is obtained, using connection 202, on tagging reference phase attribute A of feeder 112. That is, the utility chooses feeder 112 as being designated as phase attribute A.

If the reference location 100 were on phase A feeder 90 of DS transformer 75, then field client 220 would indicate phase attribute A for field probe 205 phase measurement on feeder 112 as indicated in setup table 330 illustrated in FIG. 9. However, since reference location 100 is on phase B feeder 85, field client 220 will indicate attribute C. Setup table 330 instructs the user to set phase attribute 305 to B. Then, field client 220 will correctly indicate phase attribute A for field probe 205 phase measurement on feeder 112. In effect, what setup table 330 does is allow the phase identification system to be used in reverse to setup the reference phase. The phase attribute of feeder 112 is known (because the utility designates or defines it as A) but the reference phase of feeder 85 relative to feeder 112 is not known. Setup table 330 defines what the reference phase must be called in order for the phase identification system to indicate feeder 112 as A.

Operationally, the software calculates an offset phase that is added to the GPS second instantaneous phase retrieved from base station 250 to obtain a new offset reference location instantaneous phase. The setup table indicates the value of this offset phase that must be added to the original base station 250 reference phase so that the reported field phase attribute matches the known phase attribute of the conductor being measured. These process steps 600 are listed in FIG. 10.

Additionally, if field probe 205 obtained the phase measurement via direct connection (primary reading) and field client 220 indicated a phase error of 10 degrees, then primary offset 310 would have to be set to 10 to cancel out this 10 degree phase error.

Although the offset phase described here was applied to the reference location phase, an offset phase could instead be applied to the field location phase if desired.

If a delta-wye transformer was used in transmission substation 65 and an autotransformer was used in transmission substation 102, an additional plus or minus 30 degrees phase shift would be present between feeder 85 and feeder. 112 because a 30 degree rotation does not occur in an autotransformer. In general, multiple 30 degree rotations plus arbitrary phase shifts can occur between the reference location 100 and field location 115. Phase rotations almost always exist between different classes of transmission and distribution voltages (345 KV vs. 115 KV vs. 69 KV etc).

Additionally, some large utilities became large by buying up many smaller utilities. Since feeder phase attribute designations of distribution substations are somewhat arbitrary, an identical voltage phases in two adjacent small utilities might have been designated using different phase attributes. The new large utility might not wish to retag all the phase attributes in one previous small utility to match those in the adjacent previous small utility. For example, identical field probe 205 phase measurements on the same conductor might be tagged B and C respectively in the two adjacent previously small utilities.

The keys to keeping track of all the different tagging reference phases in a utility are setup table 330, setup screen 300, and a configuration file on either field client 220 or server 245. Until a user sets up a configuration file for a substation, phase attributes displayed on the field client are essentially worthless. However, once a configuration file is created and named appropriately using the substation name and voltage (for example Kirkland-69 KV), it can be used anywhere throughout that substation's service area. Except for the occasionally tweaking of setup screen 300 connection 202 offsets to compensate for new construction or seasonal load changes, these configuration files normally never have to be changed.

An average utility might end up with between 2 to 12 different configuration files depending on its size and its number of different voltage classes. When taking new measurements in an existing configuration file service area, the user simply inputs or selects the name of the configuration file from a menu. This sets all offsets in setup screen 300 to their previously stored values.

The present invention automates this important creation of tagging reference phase configuration files. To create a new configuration file, the user first obtains a field probe 205 phase measurement on the conductor he wishes to assign a phase attribute. He then opens setup screen 300 and clicks on the radio button 328 next to the phase attribute (A, B, or C) he wishes to assign to that conductor. Next, he clicks on the autoconfigure button 335. This commands either field client 220 or server 245 software to use one or more setup tables 330 (similar to the one illustrated in FIG. 9) to determine the phase attribute 305 and connection offset 310, 315, or 320 such that the selected phase attribute will be displayed with zero phase error for that phase measurement. The software then prompts the user to save the new configuration file to an existing or new filename. At a later time, by clicking on the update offset button 340, the software will automatically adjust the offset 310, 315, or 320 for the connection type currently selected so as to reset the attribute phase error to zero.

The phase attribute 305, offsets 310, 315, and 320, and setup table 330 represents internal calculations and are not displayed to the user. The user setup screen 300 only requires to display items 328, 335, and 340 to setup a configuration file. Server 245 will automatically perform the necessary calculations and determine offset phases for each base station assigned to the user. Having these offset phases for each base station allows server 245 to automatically select the most appropriate base station, if the prime base station is temporarily down or unreliable, and apply its offset phase without any involvement by the user. Server 245 can also perform comparison checks between each base station assigned to the user to ensure no abnormalities are occurring on the selected base station. This is an important feature of the present invention because local outages and abnormal power loads in a particular area can temporarily perturb the reference phase being measured by the base station in that area. Server 245 can monitor this condition and select reference phase from an unaffected base station.

The preferred field client 220 is a smartphone which implements BLUETOOTH brand wireless technology standard short range radio 225 and its setup screen. The setup screen allows the user to pair short range radio 225 in field client 220 with short range radio 210 in field probe 205. Setup screen implementations vary depending on the brand of smartphone used for field client 220.

The present invention will allow field client 220 to select one of multiple servers 245 to use. If one server is down, another can be chosen. A field client server selection setup screen will allow the IP address and server port of each server 245 assigned to the user to be setup and saved. Server 245 administrator pages will be used to assign passwords and maintain an activity log for each user as is commonly implemented on servers. This will allow a single multi-client server 245 to support multiple different utilities. As many utility linemen already carry smartphones, field PCs, or truck laptop PCs, these utility owned devices can be used as field client 220. Thus, the multi-client server feature of the present invention allows a customer to purchase only field probe 205 to obtain the benefits of this phase identification system.

For each field probe 205 measurement taken, field client 220 will add a new record to a locally stored measurement file. Each record will contain a number of fields. As an example, the first field of the record can be the date and time that identifies when the measurement was taken. For example, the format wwww-tttttt combines the GPS week (wwww) and GPS time (tttttt). Other fields will contain the field probe 205 measured phase and configuration file used.

Figure 11:
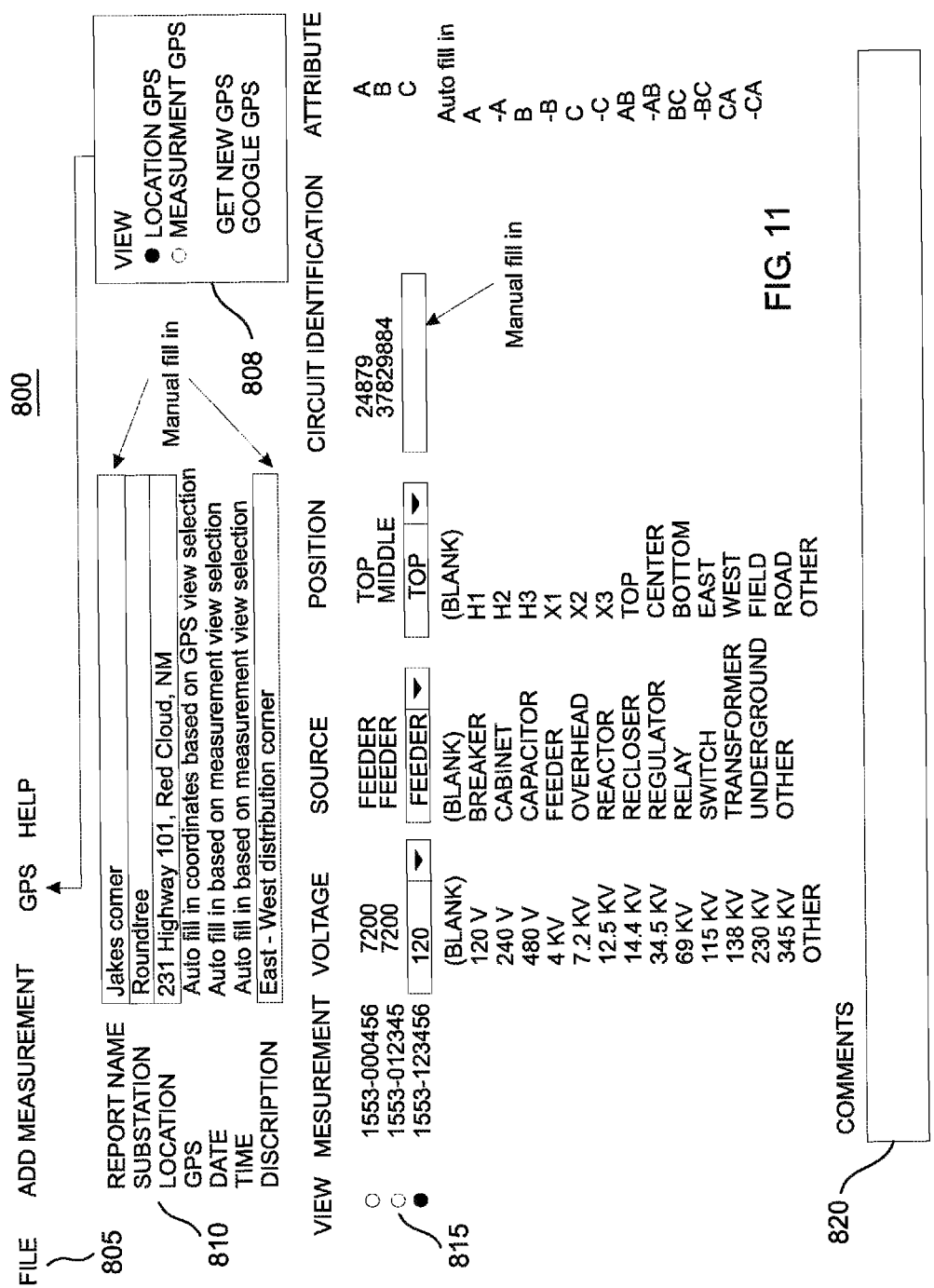
FIG. 11 illustrates an example of a report screen in which user inputs can be added to a measurement record or saved as a report file.

If servers 245 were not accessible due to being down or Internet service to them was not available, phase attribute will be requested later when service becomes available. A color coded dot can proceed each record to indicate if the record was decoded to phase attribute or not. For example, green dots can proceed decoded records and red dots for non-decoded records. This measurement file feature of the present invention allows field probe 205 measurements to be gathered and their phase attributes decoded later. Field client 220 or server 245 will also include a report screen 800 such as illustrated in FIG. 11. This screen allows a lineman to add user information about the measurement to each record.

Either prior to or after taking field probe 205 phase measurements, the manual portion of section 810 will be filled in. This information may include the report name, substation region, measurement location, and a measurement description. The location GPS coordinates, date, and time will be automatically filled in.

Section 805 allows information to be added to the measurement file form via a dropdown ADD MEASUREMENT selection menu. The dropdown will list all available measurements. The GPS button opens the GPS view window 808. The GET NEW GPS button commands field probe 205 to take another GPS location reading. This allows the user to place field probe 205 or field client 220 in a central measurement location where many satellites are in view so as to record very precise GPS coordinates. Selecting the LOCATION GPS radio button displays this GPS location in the GPS field of section 810 whereas the MEASUREMENT GPS radio button displays the GPS coordinates of the currently selected measurement in section 815. The GOOGLE GPS button provides a link to GOOGLE MAP web mapping service application so the lineman can view the selected location.

The VIEW field radio buttons in section 815 places dropdown menus on the selected measurement so the lineman can select standard responses without typing. If typing is required, OTHER is selected. The attribute field is automatically filled in assuming an attribute was determined by the field client 220 server 245. The comments section 820 allows the lineman to add extensive notes if required. Once this report form is filled out, the lineman can save it to a current or new filename via the FILE selection in section 805.

Figure 12:
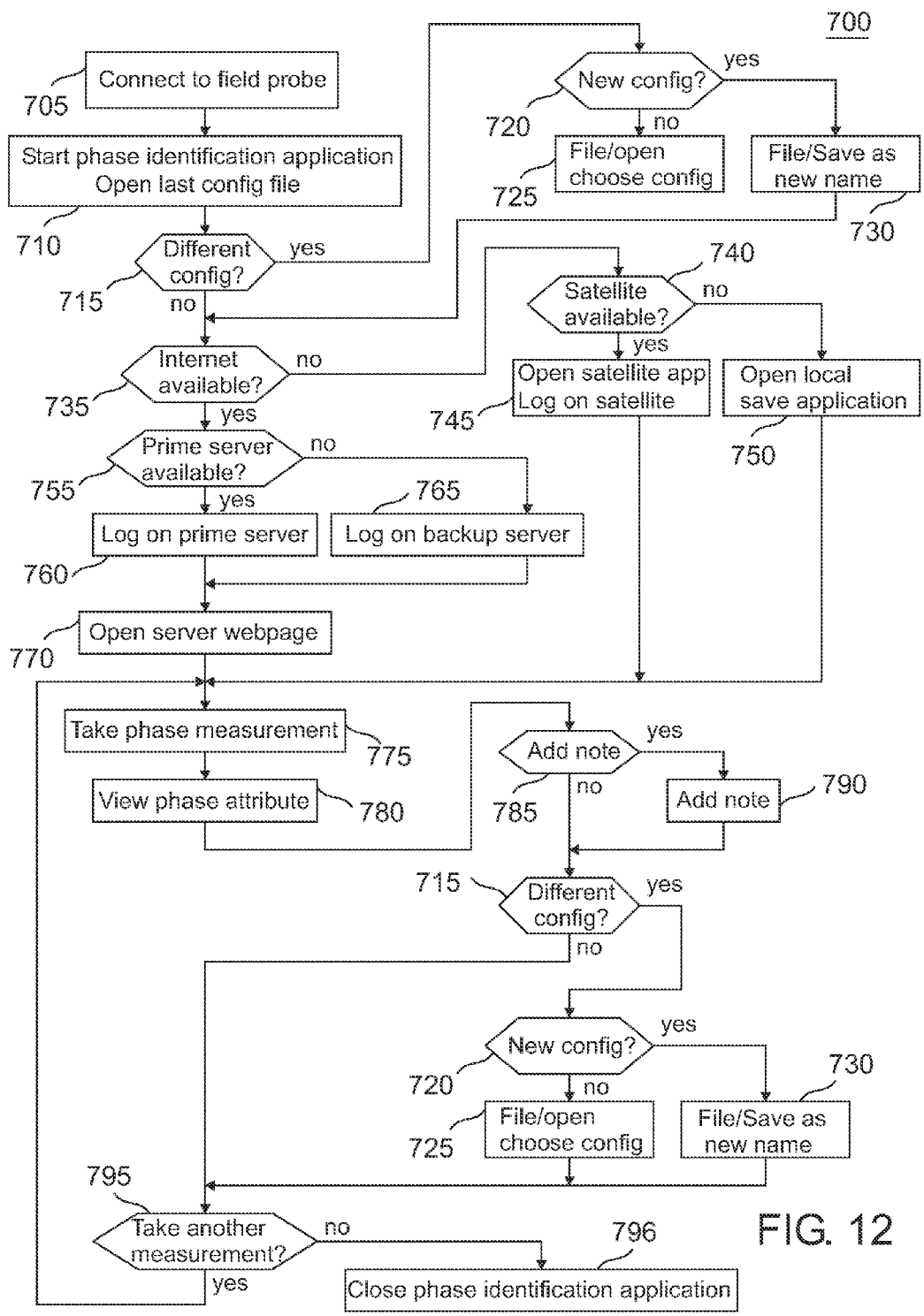
FIG. 12 illustrates a flow chart for identifying phase attribute in the present invention.

Many different software user interface applications can be written for phase identification using a smartphone field client 220. The primary goals of the smartphone application (app) in the present invention are software and user simplicity. Flowchart 700 in FIG. 12 illustrates the key elements of the preferred application.

The first user task 705 is to connect to the field probe using the BLUETOOTH brand wireless technology standard which is built into the smartphone. Once connected, the user opens the phase identification app 710 which defaults to the last used configuration file. The app will include a "File" and a "Setup" icon which the user can click on to open or create a new configuration file or to use for initial setup respectively. Setup will include items that seldom change such as user name, password, prime base station, backup base station, prime server, and backup server.

If the user desires a different configuration than used last time the app was opened, they would click on "File" 715, select "Open" 725 to choose an existing configurations, or "Save as" 730 to create a new configuration. The user can choose a new or different configuration after each phase measurement simply by clicking on "File" 715.

The app then checks if. Internet is available 735. If available, it logs onto the prime server 755 or the backup server 765 and opens the server webpage 770. If not, it checks if the user is setup to use satellite 740. If available, it opens a satellite app 745 and logs onto the satellite. If both Internet and satellite are not available, a save local app 750 is opened.

Depending on the availability of Internet or satellite, 3 different smartphone apps (or 3 different portions of a single app) are executed. If Internet is available, the most powerful app is to simply interact through a dynamic webpage generated by a web application that is driven by server 245 side software. A webpage provides an easy user interface with maximum features and data access without having to develop a complicated app on each brand of smartphone. A webpage can be viewed by any web browser already provided on a smartphone which could implement most, if not all, the app requirements.

If satellite communication must be used, the goal is to minimize the amount of data transfer since satellite data costs are expensive. The satellite app would be written to minimize the amount of data exchanged between field client 220 and server 245.

If neither Internet or satellite are available, all data will be stored on field client 220 for access later when communication services are available. The items that must always be stored on field client 220 are the configuration and measurement files. This allow the user to continue to take and save measurements when no communication with server 245 is available.

Once the app has been selected and opened, the user would take phase measurement 775 by clicking on a field client 220 icon. The results of the measurement will then be displayed 780 and a choice presented for the user to add notes 785 with this measurement. If Internet was available, these notes could be entered via the webpage which could include selections and dropdowns illustrated in FIG. 11. If Internet was not available, a small subset of the items illustrated in FIG. 11 would be supported to reduce smartphone software and memory requirements.

After viewing phase attribute 780, the user could either change to a different configuration 715, take another phase measurement 795, or close the phase identification app 796.

In the preferred implementation, a smartphone field client 220 would be used and most calculations and data storage would be hosted on server 245. However, as smartphone computing and memory resources improve or if a PC is used as field client 220, most calculations and data storage could be hosted on field client 220 and server 245 used primarily for reference location phase storage and retrieval.

A handheld implementation of field probe 205 may be implemented. This field probe will capacitive couple via proximity to the energized conductor so it doesn't have to actually touch a live conductor. This allows the handheld field probe 205 to be used by low-labor-cost non-lineman personnel. A primary use of this handheld field probe 205 is to determine and log the phase attribute and GPS location of residential power meters simply by placing the field probe close to the meter. Residence phase attribute is normally required when installing smart meters or when building a smart grid. This feature of the present invention will greatly reduce the expense of obtaining these phase attributes.

Field probe 205 may contain provisions to use a ground cable. All voltage and phase measurements take place between the conductor and ground. When the field probe is not grounded, ground reference is obtained via capacitive coupling of field probe 205 instrument case to ground. If the instrument case is close to another energized conductor, field probe 205 will partially measure voltage and phase between the two conductors and ground instead of strictly between the conductor and ground. The result is an increase in measurement phase error. Allowing the field probe to be connected to a hard ground via a ground cable removes this phase error. This feature of the present invention allows field probe 205 to be used as a precision phase meter.

Although the preferred embodiments of the invention have been illustrated and described in detail, it will be readily apparent to those skilled in the art that various modifications may be made without departing from the spirit of the invention. For example, although FIG. 3 illustrates multiple servers 245 for redundancy, equivalent redundancy may now be obtainable from commercial cloud service companies who implement similar type redundancy in their service offerings. All servers 245 illustrated in FIG. 3 except "server 1" could be eliminated assuming "server 1" is a commercial cloud service with adequate built-in redundancy.

What is claimed is:

1. A method of identifying phase in a three-phase power distribution network, said method comprising:
   providing multiple base stations at multiple reference locations, said base stations configured to measure instantaneous phase each GPS second at said multiple reference locations and store said reference locations instantaneous phase on one or more servers;
   providing a field probe at a field location, said field probe configured to measure said field location instantaneous phase at a GPS second;
   providing a field client at said field location, said field client configured to communicate with said field probe and said one or more servers;
   communicating said field probe instantaneous phase to said field client;
   transmitting said field location instantaneous phase at a GPS second and said GPS second from said field client to said one or more servers;
   automatically calculating multiple offset phases for said field location by comparing said field location instantaneous phase to said multiple reference locations instantaneous phase on said one or more servers;
   selecting most appropriate offset phase of said multiple offset phases for said field location on said one or more servers;
   automatically calculating said field location phase attribute using said most appropriate offset phase on said one or more servers; and
   transmitting said field location phase attribute to said field client for display on said field client.

2. A method as claimed in claim 1 additionally comprising:
   implementing a measurement file on said field client;
   adding a new record to said measurement file for each said field probe measurement; and
   providing means to enter user data into said record.

3. A method as claimed in claim 2 additionally comprising:
   measuring GPS coordinates of said field location; and
   displaying said GPS coordinates on said field client and storing said GPS coordinates in said measurement file.

4. A method as claimed in claim 2 wherein said providing is through a dynamic webpage generated by a web application that is driven by said one or more servers.

5. A method as claimed in claim 1 wherein said field client implementation is either a personal computer, smartphone, or personal digital assistant.

6. A method of identifying phase in a three-phase power distribution network, said method comprising:
   measuring instantaneous phase at a GPS second at multiple reference locations;
   storing said instantaneous phase from said multiple reference locations on one or more servers;
   measuring a field location instantaneous phase at said GPS second, said field location having a known phase attribute;
   communicating said field location instantaneous phase to said one or more servers;
   adding an offset phase to each said instantaneous phase from said multiple reference locations to obtain an offset instantaneous phase for each said reference locations on said one or more servers;
   comparing said field location instantaneous phase to each said offset instantaneous phase to obtain a reported phase attribute for each said reference locations on said one or more servers;
   selecting each said offset phase so that said reported phase attribute equals said known phase attribute for each said reference locations on said one or more servers;
   saving said offset phase for each said reference locations in a server configuration file on said one or more servers;
   calculating field location phase attribute in said one or more servers for field locations having an unknown phase attribute, said calculating based on instantaneous phase of said field locations having an unknown phase attribute and said server configuration file; and
   communicating said field location phase attribute to said field location from said one or more servers.

* * * * *